(12) United States Patent
Natanzon et al.

(10) Patent No.: US 11,144,506 B2
(45) Date of Patent: Oct. 12, 2021

(54) COMPRESSION OF LOG DATA USING FIELD TYPES

(71) Applicant: EMC IP Holding Company LLC, Hopkinton, MA (US)

(72) Inventors: Assaf Natanzon, Tel Aviv (IL); Amihai Savir, Sansana (IL); Avitan Gefen, Tel Aviv (IL)

(73) Assignee: EMC IP Holding Company LLC, Hopkinton, MA (US)

( * ) Notice: Subject to any disclaimer, the term of this patent is extended or adjusted under 35 U.S.C. 154(b) by 174 days.

(21) Appl. No.: 16/173,298

(22) Filed: Oct. 29, 2018

(65) Prior Publication Data

US 2020/0134046 A1   Apr. 30, 2020

(51) Int. Cl.
*G06F 16/174* (2019.01)
*G06N 20/00* (2019.01)
*G06F 16/17* (2019.01)
*G06F 16/2458* (2019.01)

(52) U.S. Cl.
CPC ...... *G06F 16/1744* (2019.01); *G06F 16/1734* (2019.01); *G06F 16/2465* (2019.01); *G06N 20/00* (2019.01)

(58) Field of Classification Search
CPC ............. G06F 16/1744; G06F 16/2465; G06F 16/1734; G06N 20/00; H03M 7/3071; H03M 7/607; H03M 7/70
See application file for complete search history.

(56) References Cited

U.S. PATENT DOCUMENTS

| | | | | |
|---|---|---|---|---|
| 9,619,478 | B1* | 4/2017 | Singh | G06F 17/40 |
| 10,515,092 | B2* | 12/2019 | Kowalczyk | G06F 16/221 |
| 2005/0086241 | A1* | 4/2005 | Ram | G06F 16/128 |
| 2005/0240582 | A1* | 10/2005 | Hatonen | G06F 16/2465 |
| 2011/0185234 | A1* | 7/2011 | Cohen | G06F 16/285 |
| | | | | 714/37 |

(Continued)

OTHER PUBLICATIONS

U.S. Appl. No. 151940,247 entitled, "Real-Time Compression of Log Data", filed Mar. 29, 2018.

(Continued)

*Primary Examiner* — Irete F Ehichioya
*Assistant Examiner* — Xiaoqin Hu
(74) *Attorney, Agent, or Firm* — Ryan, Mason & Lewis, LLP

(57) ABSTRACT

Techniques are provided for compression of log data using field types. An exemplary method comprises: obtaining at least one log message, wherein the at least one log message comprises a message template and at least one message variable, wherein the message template comprises at least one field corresponding to the at least one message variable; obtaining a compression index that maps a plurality of message templates to a corresponding message signature; identifying a predefined field type of the at least one field; selecting a compression technique to apply to the at least one message variable based on the predefined field type to obtain a compressed message variable; and writing the compressed message variable and a message signature corresponding to the message template of the at least one log message to a log file. The at least one log message can be a historical log message or part of a real-time stream of log messages.

20 Claims, 11 Drawing Sheets

(56) References Cited

U.S. PATENT DOCUMENTS

| | | | | |
|---|---|---|---|---|
| 2013/0103982 A1* | 4/2013 | Chelliah | ............ | H03M 7/3088 |
| | | | | 714/20 |
| 2013/0325690 A1* | 12/2013 | Auerbach | ............ | G06Q 40/04 |
| | | | | 705/37 |
| 2016/0105358 A1* | 4/2016 | Kannan A.S. | .......... | H04L 45/56 |
| | | | | 709/238 |
| 2017/0177227 A1* | 6/2017 | Zhang | .................. | G06F 3/0673 |
| 2018/0138921 A1* | 5/2018 | Arelakis | .............. | G06F 3/0608 |
| 2019/0347072 A1* | 11/2019 | Lo | ....................... | G06F 7/49936 |

OTHER PUBLICATIONS

U.S. Appl. No. 16/023,113 entitled, "Real-Time Viewing Tool for Compressed Log Data", filed Jun. 29, 2018.

Hamooni et al., "LogMine: Fast Pattern Recognition for Log Analytics", CIKM '16, Oct. 24-28, 2016, Indianapolis, IN, USA, DOI: http://dx.doi.org/10.1145/2983323.2983358.

* cited by examiner

HISTORICAL LOG MESSAGES 110

...
110-1: SERVER 10.101.102.1 SENT 40BYTES MESSAGE TO SERVER 10.22.35.12
110-2: SERVER 10.101.102.1 SENT 500BYTES MESSAGE TO SERVER 10.22.35.13
110-3: SERVER 10.103.102.1 SENT 41BYTES MESSAGE TO SERVER 10.22.35.11
110-4: SERVER 10.101.102.4 SENT 102BYTES MESSAGE TO SERVER 10.23.35.12
110-5: WEBMASTER STOPPED WORKING AT 9:10AM
...

LEARNED PATTERN-BASED MESSAGE TEMPLATES 210; AND MESSAGE VARIABLES 220

210-1: SERVER %s SENT %dBYTES MESSAGE TO SERVER %s; 10.101.102.1, 40, 10.22.35.12
210-2: SERVER %s SENT %dBYTES MESSAGE TO SERVER %s; 10.101.102.1, 500, 10.22.35.13
210-3: SERVER %s SENT %dBYTES MESSAGE TO SERVER %s; 10.103.102.1, 41, 10.22.35.11
210-4: SERVER %s SENT %dBYTES MESSAGE TO SERVER %s; 10.101.102.4, 102, 10.22.35.12
...

COMPRESSED LOG MESSAGE 150
150-1: #1a, 10.101.102.1, 40, 10.22.35.12
150-2: #1a, 10.101.102.1, 500, 10.22.35.13
150-3: #1a, 10.103.102.1, 41, 10.22.35.11
150-4: #1a, 10.101.102.4, 102, 10.22.35.12

FIG. 4B

WRITE-TO-FILE METHOD 600

IF MESSAGE TEMPLATE 210 IS NOT A KEY IN COMPRESSION INDEX 700:
ADD KEY = "PATTERN-BASED MESSAGE TEMPLATE" AND
VALUE = "MESSAGE SIGNATURE" TO COMPRESSION INDEX 700
ADD KEY = "MESSAGE SIGNATURE" AND VALUE = "PATTERN-BASED MESSAGE
TEMPLATE" TO DECOMPRESSION INDEX 800
ADD KEY = "PATTERN-BASED MESSAGE TEMPLATE" AND VALUE = 0 TO STATISTICS
DATABASE 950 (E.G., INITIALIZE A NEW COUNTER)

ELSE:
WRITE "MESSAGE SIGNATURE" AND VARIABLES (OPTIONALLY, COMPRESSED USING
COMPRESSION BASED ON FIELD TYPE) OF MESSAGE INTO LOG FILE
INCREASE COUNTER THAT MAPPED TO "PATTERN-BASED MESSAGE TEMPLATE" IN
STATISTICS DATABASE 950

FIG. 6

COMPRESSION INDEX 700

| PATTERN-BASED TEMPLATE (KEY) | SIGNATURE |
|---|---|
| "text-1,1 %d text-2,1%s, text-3,1 %..., text-n" | 01x |
| "text-1 %d text-2 %s, text-3 %..., text-n" | 02x |
| "text-1,3 %d text-2,3 %s, text-3,3 %..., text-n" | 03x |
| "text-1,k %d text-2,k %s, text-3,k %..., text-n" | FAx |

FIG. 7

DECOMPRESSION (REVERSE) INDEX 800

| SIGNATURE (KEY) | PATTERN-BASED TEMPLATE |
|---|---|
| 01x | "text-1,1 %d text-2,1%s, text-3,1 %..., text-n" |
| 02x | "text-1 %d text-2 %s, text-3 %..., text-n" |
| 03x | "text-1,3 %d text-2,3 %s, text-3,3 %..., text-n" |
| FAx | "text-1,k %d text-2,k %s, text-3,k %..., text-n" |

FIG. 8

STATISTICS DATABASE 950

| PATTERN-BASED TEMPLATE (KEY) | COUNTER |
|---|---|
| "text-1,1 %d text-2,1%s, text-3,1 %..., text-n" | 1024 |
| "text-1 %d text-2 %s, text-3 %..., text-n" | 10 |
| "text-1,3 %d text-2,3 %s, text-3,3 %..., text-n" | 173 |
| "text-1,k %d text-2,k %s, text-3,k %..., text-n" | 207 |

COMPRESSION OF LOG DATA USING FIELD TYPES

CROSS-REFERENCE TO RELATED APPLICATION(S)

The present application is related to United States patent application Ser. No. 16/173,306, entitled "Compression of Log Data Using Pattern Recognition," filed Oct. 29, 2018, and incorporated by reference herein in its entirety.

FIELD

The field relates generally to the processing of log messages.

BACKGROUND

Traditional log file systems typically store all of the log data generated by a monitored system, such as software and/or hardware applications. Log files often contain uninformative information that reappears in multiple log messages. Such uninformative information is stored in the log file system, consuming storage resources and creating challenges for data analysis tasks.

A need therefore exists for techniques for reducing the size of log file systems and for easing log data analysis tasks.

SUMMARY

Illustrative embodiments of the present disclosure provide for compression and decompression of log data, such as a real-time compression and decompression of log data. In one embodiment, an exemplary method comprises: obtaining at least one log message, wherein the at least one log message comprises a message template and at least one message variable, wherein the message template comprises at least one field corresponding to the at least one message variable; obtaining a compression index that maps a plurality of message templates to a corresponding message signature; identifying a predefined field type of the at least one field; selecting a compression technique to apply to the at least one message variable based on the predefined field type to obtain a compressed message variable; and writing the compressed message variable and a message signature corresponding to the message template of the at least one log message to a log file. The at least one log message can be a historical log message or part of a real-time stream of log messages.

In some embodiments, the selected compression technique compresses the at least one message variable by employing one or more of a reduced granularity and a reduced precision of the at least one message variable, relative to one or more of an original granularity and an original precision of the at least one message variable. In further variations, the selected compression technique compresses the at least one message variable using a difference between a predicted next value of the at least one message variable and an actual value of the at least one message variable and/or a difference between a current value of the at least one message variable and a base value of the at least one message variable.

Other illustrative embodiments include, without limitation, apparatus, systems, methods and computer program products comprising processor-readable storage media.

BRIEF DESCRIPTION OF THE DRAWINGS

FIG. 4B illustrates a set of pattern-based message templates learned from exemplary historical log messages, and corresponding compressed log messages, according to at least one embodiment of the disclosure;

FIG. 6 illustrates exemplary pseudo code for a write-to-file method, according to an embodiment of the disclosure;

FIG. 7 is a table illustrating an exemplary compression index that may be used by the exemplary log message compression module of FIG. 5, according to one embodiment;

FIG. 8 is a table illustrating an exemplary decompression index that may be used by the exemplary log message compression module of FIG. 5, according to an embodiment;

DETAILED DESCRIPTION

Figure 1:
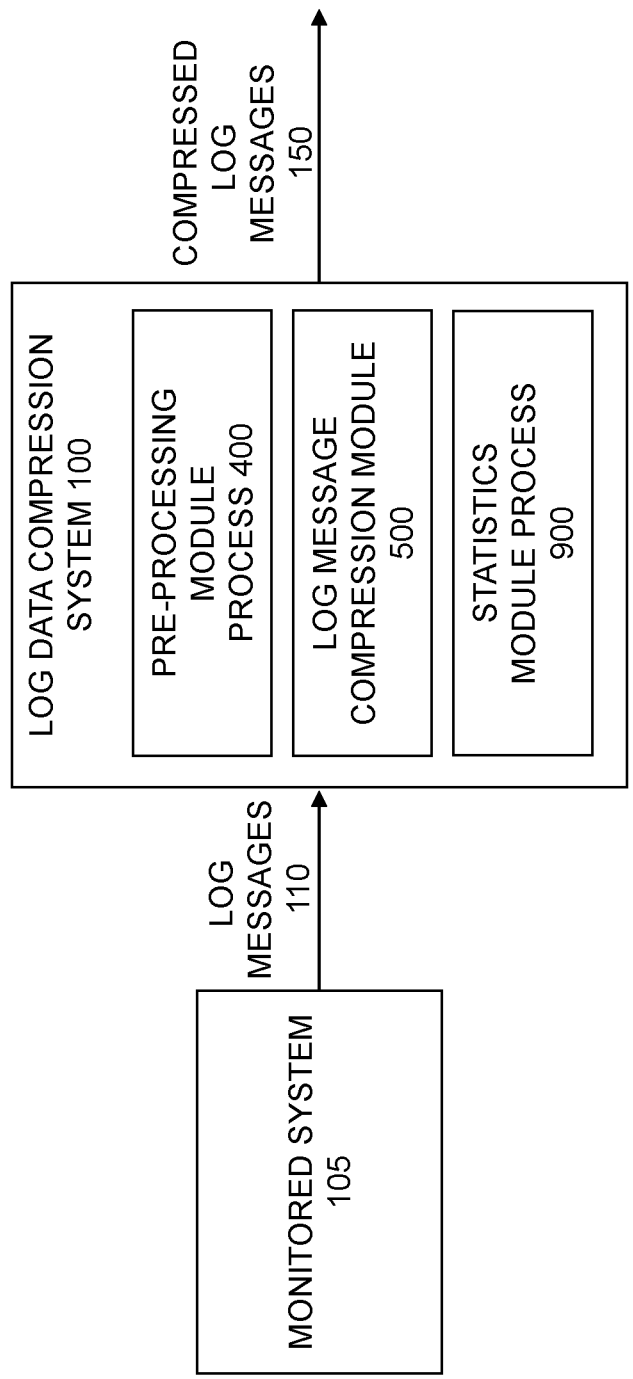
FIG. 1 illustrates an exemplary log data compression system, according to an embodiment of the disclosure.

Illustrative embodiments of the present disclosure will be described herein with reference to exemplary communication, storage and processing devices. It is to be appreciated, however, that the disclosure is not restricted to use with the particular illustrative configurations shown. One or more embodiments of the disclosure provide for compression and decompression of log data using pattern recognition and/or field-based compression techniques.

Traditional log file systems typically store the entire log message generated by the monitored software and/or hardware applications regardless of the constant, repetitive text that may be in the log messages. U.S. patent application Ser. No. 15/940,247, filed Mar. 29, 2018, (now U.S. Pat. No. 11,023,420), entitled "Real-Time Compression of Log Data," incorporated by reference herein in its entirety, provides for compression and decompression of log data, such as a real-time compression and decompression of log data. In one or more embodiments, log messages are compressed by storing portions of log messages that reappear in other log messages only once and representing the reappearing portions (referred to herein as a message template) using a short sequence of characters (referred to herein as a signature). In some embodiments, the length of the sequence is determined by a number of occurrences of the given text. Generally, in some embodiments, a given message signature is assigned to a particular message template based on a length of the given message signature and a frequency of occurrence of the particular message template (e.g., the more frequent the occurrences, the shorter the sequence length of the signature). The disclosed log message reduction techniques significantly reduce the size of the log files and simplify log analysis tasks in a fully automated manner.

In some embodiments, log pattern mining techniques are applied to historical log messages to learn patterns that repeat in the historical log messages. Thus, pattern-based message templates are learned as reappearing portions of log messages that appear in multiple log messages. Log messages can be compressed in real-time by storing the reappearing pattern-based message template portions of log messages only once and representing the reappearing portions (referred to herein as a pattern-based message template) using a signature comprising a short sequence of characters. Among other benefits, the log pattern mining techniques applied to the historical log messages allow the message templates to be learned without requiring access to the source code. In this manner, the disclosed log data reduction techniques are source code and product agnostic and can generally be used to compress any log data generated by any software or system that generates log messages.

In at least one embodiment, one or more fields appearing in the pattern-based message templates are identified and classified as having one or more predefined field types. The message variables corresponding to the predefined field types are optionally compressed using a field-specific compression technique selected based on the predefined field type. For example, the predefined field type may be a timestamp, and a compression technique is selected to compress the timestamp based on a performance of a plurality of available compression techniques for compressing timestamps, as discussed further below in a section entitled "Field-Based Log Data Compression."

Quality Assurance and software engineers spend a substantial amount of time analyzing complex log files. Their goal is usually to gain a better understanding of the set of events that led to a specific outcome. In most cases, this is a tedious task that requires reviewing numerous textual messages. While some of those messages are highly informative, other messages (or large portions thereof) can have no additive value, since such messages are always coupled with fixed text that appears before and after the real information that they try to express; for machine learning and natural language processing methods such messages do not contribute any significant information.

Event logs are stored by default as plain text on some local and/or remote servers. Having a substantial amount of reoccurring text sequences increases the consumption of storage resources and therefore, increases costs for log data owners. This problem becomes even more challenging when a regulation or law is in place and the companies have challenges storing data for a specified time period.

FIG. 1 illustrates an exemplary log data compression system 100, according to an embodiment of the disclosure. As shown in FIG. 1, the exemplary log data compression system 100 processes log messages 110 from a monitored system 105, such as a software and/or hardware application, and generates a set of compressed log messages 150. Generally, log messages are compressed by storing message template portions of log messages that reappear in other log messages only once and representing the message template using a short signature sequence of characters, as discussed further below in conjunction with FIG. 2.

The exemplary log data compression system 100 comprises a pre-processing module process 400, as discussed further below in conjunction with FIGS. 4A and 4B, a log message compression module 500, as discussed further below in conjunction with FIG. 5, and a statistics module process 900, as discussed further below in conjunction with FIG. 9A.

Generally, the pre-processing module process 400 learns patterns from historical log data using a log pattern mining technique to create one or more pattern-based message templates to create a mapping from each pattern-based message template to a short signature sequence of characters. The exemplary write-to-file method 600, as discussed further below in conjunction with FIG. 6, implements the log message reduction techniques disclosed herein, using a compression index discussed further below in conjunction with FIG. 7, while maintaining a statistics database discussed further below in conjunction with FIG. 9A. Generally, the statistics database is used by the statistics module process 900 (FIG. 9A) to assign message signatures to particular message templates based on a length of the given message signature and a frequency of occurrence of the particular message template.

Figure 2:
FIG. 2 provides an example of a log message, according to some embodiments.

FIG. 2 provides an example of a log message 200, according to some embodiments. As shown in FIG. 2, the exemplary log message 200 comprises a pattern-based message template 210 of "text . . . % s, text . . . % d, text . . . " and one or more message variables 220 "var1, var2". Generally, portions of the pattern-based message template 210 are replaced with the message variables 220, in a known manner. For example, the characters "% s" in the pattern-based message template 210 are replaced by the first message variable 220 ("var1") and the characters "ds" in the pattern-based message template 210 are replaced by the second message variable 220 ("var2").

Figure 3:
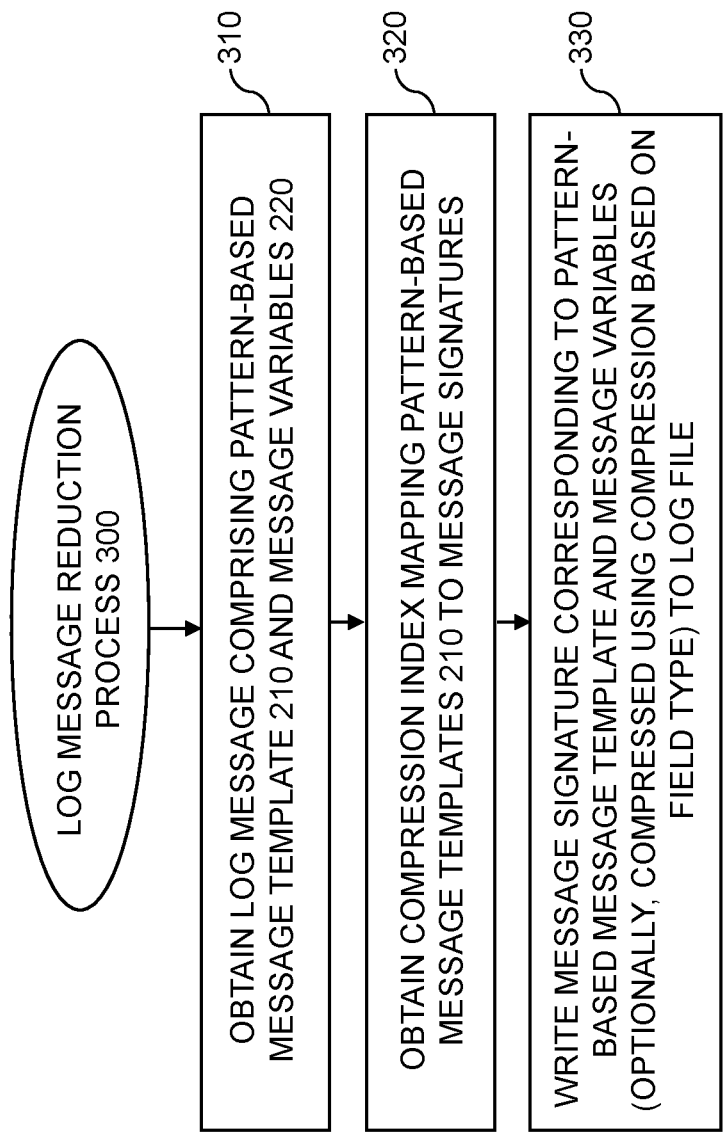
FIG. 3 is a flow chart illustrating a log message reduction process, according to an embodiment.

FIG. 3 is a flow chart illustrating a log message reduction process 300, according to an embodiment of the disclosure. As shown in FIG. 3, the exemplary log message reduction process 300 initially obtains a log message during step 310 comprising a pattern-based message template 210 and one or more message variables 220. In addition, the exemplary log message reduction process 300 obtains a compression index during step 320 that maps pattern-based message templates 210 to corresponding message signatures, as discussed further below in conjunction with FIG. 7. Finally, the log data compression system 100 writes the message signature from the compression index (FIG. 7) that corresponds to the pattern-based message template 210 and the message variables to a log file during step 330. One or more message variables are optionally compressed during step 330 using a compression technique selected based on a predefined field type of the message variable(s), as discussed further below in a section entitled "Field-Based Log Data Compression."

Thus, one or more aspects of the disclosure recognize that log messages often comprise network addresses, time and counters, as well as other fields that can be predicted. Thus, field-based compression techniques can be applied to fields of a predefined field type in order to achieve additional compression performance improvements.

Figure 4A:
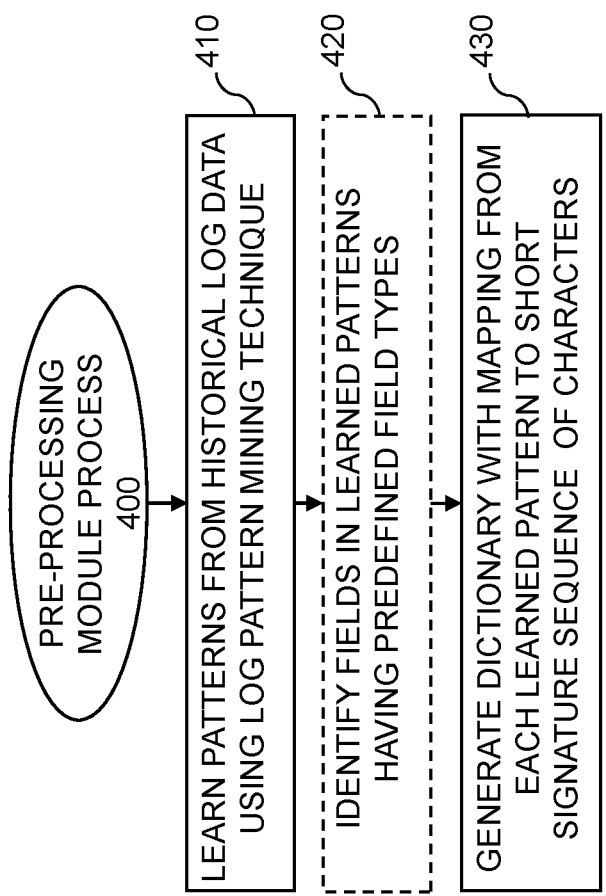
FIG. 4A is a flow chart illustrating the pre-processing module process of FIG. 1 in further detail, according to some embodiments.

FIG. 4A is a flow chart illustrating the pre-processing module process 400 of FIG. 1 in further detail, according to some embodiments. As shown in FIG. 4A, the exemplary pre-processing module process 400 initially learns patterns from historical log data during step 410 using a log pattern mining technique (e.g., Hossein Hamooni et al., "LogMine: Fast Pattern Recognition for Log Analytics," Int'l Conf. on Information and Knowledge Management (CIKM 2016), Oct. 24, 2016, incorporated by reference herein in its entirety. Generally, such log pattern mining techniques collect log data and identify patterns representing large groups of log messages. For example, the log pattern mining technique can represent the patterns using a regular expression describing each pattern.

Generally, the log pattern mining techniques applied to the historical log messages during step 410 allow the pattern-based message templates 210 to be learned without requiring access to the source code. In some embodiments, the patterns that are learned during step 410 of a training phase from the historical log messages are subsequently used at run-time to split new log messages automatically into pattern-based message templates 210 based on the learned patterns and message variables 220. The exemplary log pattern mining techniques cluster the historical log messages into K clusters, and K is increased until a robust set of patterns is obtained that covers a sufficient number of the historical log messages. For example, the pattern recognition pipeline may comprise a tokenization and type detector that generalizes the log structure (e.g., an IP (Internet Protocol) address such as 10.2.3.4 can be replaced by the label IP as a predefined field type, and a timestamp can be replaced by the label TS). The clustering optionally employs an "edit distance" metric and a one-pass version of a friends-of-friend clustering to create clusters from of the historical log dataset.

In one or more embodiments, the exemplary pre-processing module process 400 optionally identifies fields in the learned patterns during step 420 having one or more predefined field types. As noted above, one or more message variables from log messages are optionally compressed during step 330 using a compression technique selected based on a predefined field type of the message variable(s), as discussed further below in a section entitled "Field-Based Log Data Compression."

A dictionary is generated during step 430 with a mapping of each learned pattern (e.g., the pattern-based message templates 210) to a short signature sequence of characters, in order to create the compression index 700 (FIG. 7).

FIG. 4B illustrates a set of pattern-based message templates 210 learned from exemplary historical log messages 110, and corresponding compressed log messages 150, according to at least one embodiment of the disclosure. As shown in FIG. 4B, plain text (e.g., uncompressed) historical log messages 110-1 through 110-5 are processed by the log pattern mining technique during step 410 to learn patterns that represent multiple historical log messages and to generate corresponding pattern-based message templates 210-1 through 210-4. Generally, each line of the historical log messages 110-1 through 110-4 is mapped into a learned pattern expressed as a pattern-based message template 210, as well as the variables within the respective line of historical log messages 110-1 through 110-4. Log message 110-5 is not part of the same part as log messages 110-1 through 110-4.

In addition, the message variables 220 are also optionally extracted from the historical log messages 110 and provided with the corresponding pattern-based message template 210-1 through 210-4.

The corresponding compressed log messages 150-1 through 150-4 are generated by writing the message signature from the compression index 700 (FIG. 7) that corresponds to the pattern-based message template 210 and the message variables 220 (optionally, compressed using a compression technique selected based on a predefined field type of the message variable 220) to a log file.

Figure 5:
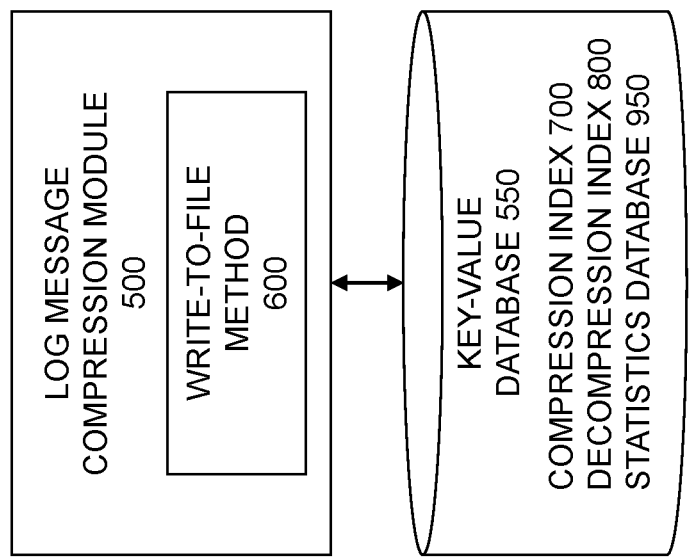
FIG. 5 illustrates the log message compression module of FIG. 1 in further detail, according to one embodiment of the disclosure.

FIG. 5 illustrates the log message compression module 500 of FIG. 1 in further detail, according to at least one embodiment of the disclosure. As shown in FIG. 5, the exemplary log message compression module 500 comprises the write-to-file method 600, as discussed further below in conjunction with FIG. 6. Generally, the write-to-file method 600 implements the log message reduction techniques disclosed herein, using the compression index 700 (FIG. 7), while maintaining the statistics database 950 (FIG. 9B). The decompression index 800 (FIG. 8) is used to decompress compressed log messages 150 to restore the original log messages 110.

The compression index 700, decompression index 800, and statistics database 950 are optionally stored in a key-value database 550. In the exemplary compression index 700, the keys correspond to message templates; and the values correspond to message signatures. In the exemplary decompression index 800, the keys correspond to message signatures; and the values correspond to message templates (e.g., providing a reverse index). In the exemplary statistics database 950, the keys correspond to message templates; and the values correspond to an occurrences counter (for statistics).

FIG. 6 illustrates exemplary pseudo code for a write-to-file method 600, according to an embodiment of the disclosure. Generally, the write-to-file method 600 is called for each log message to be compressed, and the write-to-file method 600 replaces the constant text (template) of the log message with the mapped character sequence (e.g., the message signature), and then writes the message signature and the variables from the log message.

As shown in FIG. 6, the exemplary write-to-file method 600 is applied to a log message 110 having a "message template" and a "message signature." If a pattern-based message template portion 210 of the log message 110 is not a key in the compression index 700, then a key of "message template" and a value of "message signature" are added to the compression index 700; a key of "message signature" and a value of "message template" are added to the decompression index 800; and a key of "message template" and a value of 0 are added to the statistics database 950 (e.g., to initialize a new counter). Otherwise, the "message signature" and the variables of the log message 110 are written into the log file, and the counter in statistics database 950 that mapped to this "message template" is increased. One or more message variables are optionally compressed using a compression technique selected based on a predefined field type of the message variable(s), as discussed further below in a section entitled "Field-Based Log Data Compression."

For example, for the exemplary log message ("text . . . % s, text . . . % d, text . . . ", var1, var2)"), the write-to-file method 600 will write the following line into the log file: # A0 var1 var2 (e.g., the template "text . . . % s, text . . . % d, text . . . " is changed to the signature # A0); and will increase the counter that mapped to the message template in the statistics database 950. If var2 has a predefined field type of a timestamp, for example, a compression technique can be selected to compress the timestamp based on a performance of a plurality of available compression techniques for compressing timestamps, as discussed further below.

FIG. 7 is a table illustrating an exemplary compression index 700 that may be used by the exemplary log message compression module 500 of FIG. 5, according to one embodiment. As shown in FIG. 7, in the exemplary compression index 700, the keys correspond to pattern-based message templates, and the values correspond to message signatures. For example, the exemplary compression index 700 maps the pattern-based message template "text-1,3% d text-2,3% s, text-3,3% . . . , text-n" to a signature of "03x".

FIG. 8 is a table illustrating an exemplary decompression index 800 that may be used by the exemplary log message compression module 500 of FIG. 5, according to an embodiment. As shown in FIG. 8, in the exemplary decompression index 800, the keys correspond to message signatures; and the values correspond to pattern-based message templates (e.g., providing a reverse index). For example, the exemplary decompression index 800 (reverse index) maps the signature of "03x" back to a pattern-based message template of "text-1,3% d text-2,3% s, text-3,3% . . . , text-n."

Figures 9A, 9B:
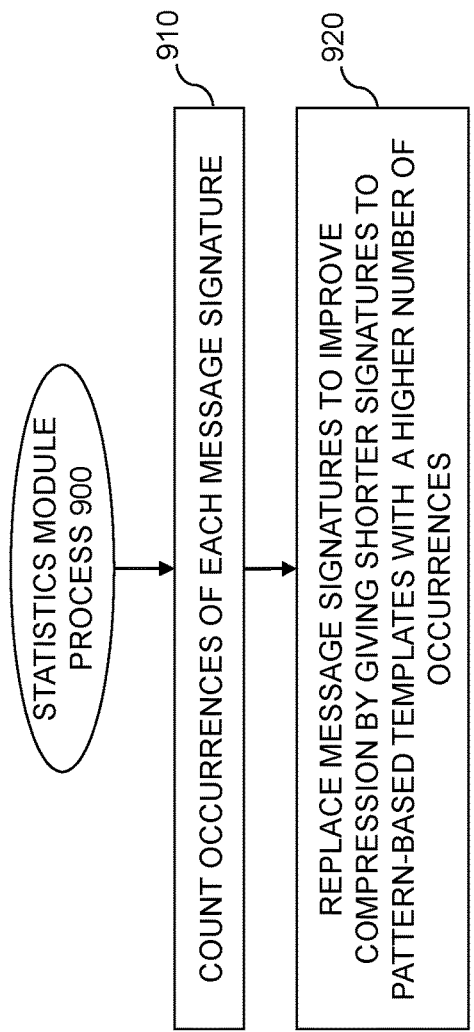
FIG. 9A is a flow chart illustrating the statistics module process of FIG. 1 in further detail, according to some embodiments.
FIG. 9B is a table illustrating an exemplary statistics database that may be used by the exemplary log message compression module of FIG. 5, according to one embodiment.

FIG. 9A is a flow chart illustrating the statistics module process 900 of FIG. 1 in further detail, according to some embodiments. Generally, the exemplary statistics module process 900 counts the occurrences of each message signature and according to the number of times each message template (e.g., pattern-based message templates) has occurred across the log messages, relative to occurrences of other message templates, the exemplary statistics module process 900 will replace the message signatures to improve the compression by giving the pattern-based message templates 210 with a higher number of occurrences the signatures with the shorter lengths. The reassignment can be done, for example, from time to time using an offline process that will run in the background.

As shown in FIG. 9A, the exemplary statistics module process 900 counts occurrences of each message signature during step 910 and replaces message signatures during step 920 to improve compression by giving shorter signatures to pattern-based message templates 210 with a higher number of occurrences. In this manner, a given message signature is assigned to a particular pattern-based message template 210 based on a length of the given message signature and a frequency of occurrence of the particular message template.

FIG. 9B is a table illustrating an exemplary statistics database 950 that may be used by the exemplary log message compression module 500 of FIG. 5, according to one embodiment. As shown in FIG. 9B, in the exemplary statistics database 950, the keys correspond to message templates (e.g., pattern-based message templates 210); and the values correspond to an occurrences counter (for statistics). Generally, the exemplary statistics database 950 indicates the number of occurrences of each pattern-based message template 210.

Field-Based Log Data Compression

As noted above, in at least one embodiment, one or more fields appearing in the message templates, such as pattern-based message templates 210, are identified and classified as having one or more predefined field types. The message variables corresponding to the predefined field types from incoming log messages, for example, are optionally compressed using a field-specific compression technique selected based on the predefined field type. For example, the predefined field type may be a timestamp and a compression technique is selected to compress the timestamp based on a performance of a plurality of available compression techniques for compressing timestamps.

One or more aspects of the disclosure recognize that many fields, such as network address, date and time have a specific format. Once the pattern-based message templates 210 are identified (e.g., by analyzing the source code or using the disclosed pattern recognition techniques) a parsing algorithm can be applied to the pattern-based message templates 210 to identify the format of one or more fields of each pattern-based template 210.

In some embodiments, the identified fields are divided into several groups based on predefined field types, such as date and time; integers; network addresses, such as IP addresses; function names; and variable texts.

Time-based fields are optionally compressed by keeping the time as a number or as a differential value from the start time of the log (e.g., a base value). For example, the following exemplary date/time field "2016-12-29 00:00:00:08, 749" can be stored as a number in microseconds since the log started.

If var2 from FIG. 2, for example, has a predefined field type of a timestamp, for example, a compression technique can be selected to compress the timestamp based on a performance of a plurality of such available compression techniques for compressing timestamps.

In further variations, a prediction algorithm can be used to estimate the time of the next log entry and the difference between the estimation and the actual time value can be stored in the log to further reduce the amount of data needed to keep the date/time.

Integer fields, for example, can be evaluated to determine if the fields comprise counters. Counters can be identified, for example, by evaluating sequential appearances of the same log, and identifying if the numbers are indeed a sequence.

Counters are optionally compressed by calculating an estimated counter for the next log entry. Rather than keeping the full counter value, the difference can be stored between the counter and the previous counter value (in many cases, the value will be one, for example, which will allow better compression). When the counter data is decompressed, the correct value will be recalculated.

The user may also optionally allow some lossy compression to one or more fields. For example, in some cases, the complete time accuracy may not be needed at the level of milliseconds (for example) and thus the compression algorithm can replace the time field with a lower granularity to farther improve the compression.

In some embodiments, the disclosed techniques for real-time compression of log data using log pattern mining significantly reduce storage requirements in terms of capacity and improve analysis over the log data.

Among other benefits, the disclosed log message reduction techniques parse a received log message into a pattern-based message template 210 and one or more message variables 220. The message variables 220 from the log message 200 and the message signature that corresponds to the message template of the log message in a compression index 700 are written to a log file to store the log message in a compressed format.

One or more embodiments of the disclosure provide improved methods, apparatus and computer program products for log message reduction using log pattern mining and/or field-based compression. The foregoing applications and associated embodiments should be considered as illustrative only, and numerous other embodiments can be configured using the techniques disclosed herein, in a wide variety of different applications.

It should also be understood that the disclosed log message reduction techniques, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed techniques for log message reduction may be implemented using one or more processing platforms.

One or more of the processing modules or other components may therefore each run on a computer, storage device or other processing platform element. A given such element may be viewed as an example of what is more generally referred to herein as a "processing device."

As noted above, illustrative embodiments disclosed herein can provide a number of significant advantages relative to conventional arrangements. For example, the disclosed techniques for log message reduction based on log pattern mining can be used as a real-time library to compress incoming log messages and as an ad hoc tool that reduces the size of an existing log file system offline.

It is to be appreciated that the particular advantages described above and elsewhere herein are associated with particular illustrative embodiments and need not be present in other embodiments. Also, the particular types of information processing system features and functionality as illustrated and described herein are exemplary only, and numerous other arrangements may be used in other embodiments.

In these and other embodiments, compute services can be offered to cloud infrastructure tenants or other system users as a Platform as a Service (PaaS) offering, although numerous alternative arrangements are possible.

Some illustrative embodiments of a processing platform that may be used to implement at least a portion of an information processing system comprise cloud infrastructure including virtual machines implemented using a hypervisor that runs on physical infrastructure. The cloud infrastructure further comprises sets of applications running on respective ones of the virtual machines under the control of the hypervisor. It is also possible to use multiple hypervisors each providing a set of virtual machines using at least one underlying physical machine. Different sets of virtual machines provided by one or more hypervisors may be utilized in configuring multiple instances of various components of the system.

These and other types of cloud infrastructure can be used to provide what is also referred to herein as a multi-tenant environment. One or more system components such as a log data compression system 100, or portions thereof, are illustratively implemented for use by tenants of such a multi-tenant environment.

Cloud infrastructure as disclosed herein can include cloud-based systems such as Amazon Web Services (AWS), Google Cloud Platform (GCP) and Microsoft Azure. Virtual machines provided in such systems can be used to implement at least portions of a log data compression platform in illustrative embodiments. The cloud-based systems can include object stores such as Amazon S3, GCP Cloud Storage, and Microsoft Azure Blob Storage.

In some embodiments, the cloud infrastructure additionally or alternatively comprises a plurality of containers implemented using container host devices. For example, a given container of cloud infrastructure illustratively comprises a Docker container or other type of Linux Container (LXC). The containers may run on virtual machines in a multi-tenant environment, although other arrangements are possible. The containers may be utilized to implement a variety of different types of functionality within the storage devices. For example, containers can be used to implement respective processing devices providing compute services of a cloud-based system. Again, containers may be used in combination with other virtualization infrastructure such as virtual machines implemented using a hypervisor.

Illustrative embodiments of processing platforms will now be described in greater detail with reference to FIGS. 10 and 11. These platforms may also be used to implement at least portions of other information processing systems in other embodiments.

Figure 10:
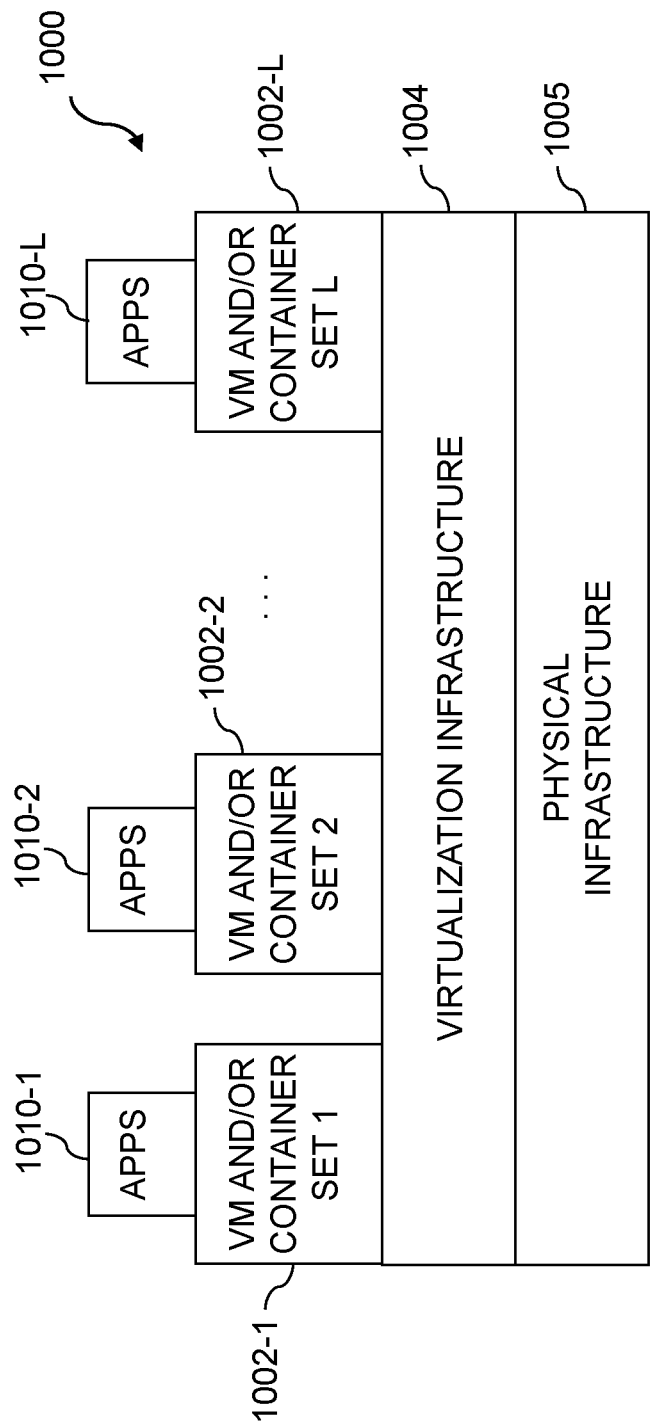
FIG. 10 illustrates an exemplary processing platform that may be used to implement at least a portion of one or more embodiments of the disclosure comprising a cloud infrastructure.

FIG. 10 shows an example processing platform comprising cloud infrastructure 1000. The cloud infrastructure 1000 comprises a combination of physical and virtual processing resources that may be utilized to implement at least a portion of the log data compression system 100. The cloud infrastructure 1000 comprises multiple virtual machines (VMs) and/or container sets 1002-1, 1002-2, . . . 1002-L implemented using virtualization infrastructure 1004. The virtualization infrastructure 1004 runs on physical infrastructure 1005, and illustratively comprises one or more hypervisors and/or operating system level virtualization infrastructure. The operating system level virtualization infrastructure illustratively comprises kernel control groups of a Linux operating system or other type of operating system.

The cloud infrastructure 1000 further comprises sets of applications 1010-1, 1010-2, . . . 1010-L running on respective ones of the VMs/container sets 1002-1, 1002-2, . . . 1002-L under the control of the virtualization infrastructure 1004. The VMs/container sets 1002 may comprise respective VMs, respective sets of one or more containers, or respective sets of one or more containers running in VMs.

In some implementations of the FIG. 10 embodiment, the VMs/container sets 1002 comprise respective VMs implemented using virtualization infrastructure 1004 that comprises at least one hypervisor. Such implementations can provide log message reduction functionality of the type described above for one or more processes running on a given one of the VMs. For example, each of the VMs can implement log message reduction control logic and associated compression and decompression tables for providing log message reduction functionality for one or more processes running on that particular VM.

An example of a hypervisor platform that may be used to implement a hypervisor within the virtualization infrastructure 1004 is the VMware® vSphere® which may have an associated virtual infrastructure management system such as the VMware® vCenter™. The underlying physical machines may comprise one or more distributed processing platforms that include one or more storage systems.

In other implementations of the FIG. 10 embodiment, the VMs/container sets 1002 comprise respective containers implemented using virtualization infrastructure 1004 that provides operating system level virtualization functionality, such as support for Docker containers running on bare metal hosts, or Docker containers running on VMs. The containers are illustratively implemented using respective kernel control groups of the operating system. Such implementations can provide log message reduction functionality of the type described above for one or more processes running on different ones of the containers. For example, a container host device supporting multiple containers of one or more container sets can implement one or more instances of log message reduction control logic and associated compression and decompression tables for use in log message reduction.

As is apparent from the above, one or more of the processing modules or other components of system 100 may each run on a computer, server, storage device or other processing platform element. A given such element may be viewed as an example of what is more generally referred to herein as a "processing device." The cloud infrastructure 1000 shown in FIG. 10 may represent at least a portion of one processing platform. Another example of such a processing platform is processing platform 1100 shown in FIG. 11.

The processing platform 1100 in this embodiment comprises at least a portion of the given system and includes a plurality of processing devices, denoted 1102-1, 1102-2, 1102-3, ... 1102-K, which communicate with one another over a network 1104. The network 1104 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 1102-1 in the processing platform 1100 comprises a processor 1110 coupled to a memory 1112. The processor 1110 may comprise a microprocessor, a microcontroller, an application specific integrated circuit (ASIC), a field programmable gate array (FPGA) or other type of processing circuitry, as well as portions or combinations of such circuitry elements, and the memory 1112, which may be viewed as an example of a "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 1102-1 is network interface circuitry 1114, which is used to interface the processing device with the network 1104 and other system components, and may comprise conventional transceivers.

The other processing devices 1102 of the processing platform 1100 are assumed to be configured in a manner similar to that shown for processing device 1102-1 in the figure.

Again, the particular processing platform 1100 shown in the figure is presented by way of example only, and the given system may include additional or alternative processing platforms, as well as numerous distinct processing platforms in any combination, with each such platform comprising one or more computers, storage devices or other processing devices.

Figure 11:
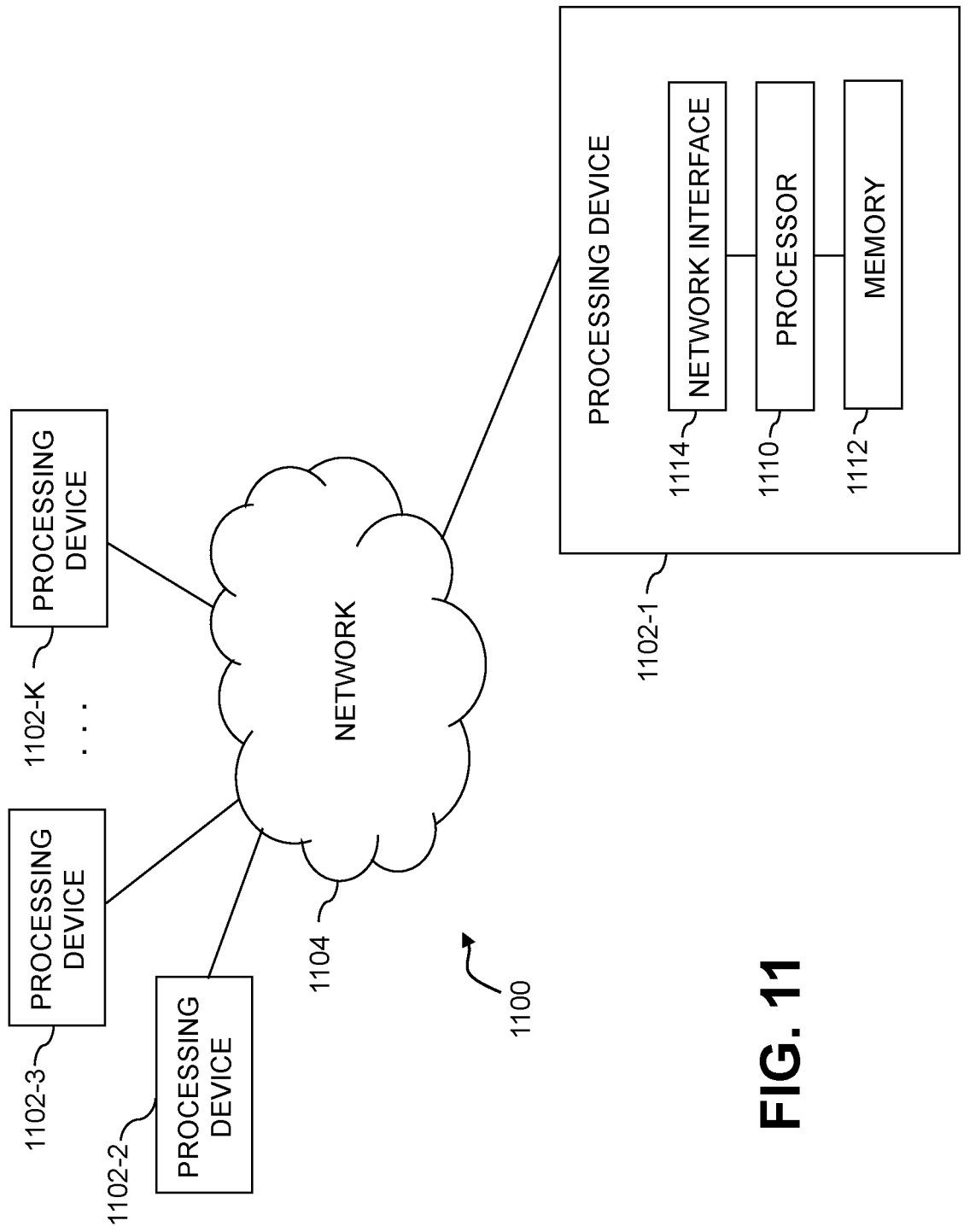
FIG. 11 illustrates another exemplary processing platform that may be used to implement at least a portion of one or more embodiments of the disclosure.

Multiple elements of the log data compression system may be collectively implemented on a common processing platform of the type shown in FIG. 10 or 11, or each such element may be implemented on a separate processing platform.

For example, other processing platforms used to implement illustrative embodiments can comprise different types of virtualization infrastructure, in place of or in addition to virtualization infrastructure comprising virtual machines. Such virtualization infrastructure illustratively includes container-based virtualization infrastructure configured to provide Docker containers or other types of LXCs.

As another example, portions of a given processing platform in some embodiments can comprise converged infrastructure such as VxRail™, VxRack™, VxBlock™, or Vblock® converged infrastructure commercially available from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the information processing system. Such components can communicate with other elements of the information processing system over any type of network or other communication media.

As indicated previously, components of an information processing system as disclosed herein can be implemented at least in part in the form of one or more software programs stored in memory and executed by a processor of a processing device. For example, at least portions of the functionality shown in one or more of the figures are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A method, comprising:
   obtaining at least one log message of a plurality of log messages, wherein the at least one log message comprises a message template and one or more message variable values, wherein the message template is repeated across the plurality of log messages and comprises at least one field that is replaced with at least one of the one or more message variable values;
   incrementing a counter, associated with the message template, indicating a frequency of occurrence of the message template, wherein the counter is one of a plurality of counters each associated with a respective one of a plurality of different message templates;
   obtaining a compression index that maps each of the plurality of different message templates to a corresponding message signature of a plurality of message signatures, wherein the mapping assigns a given message signature to a particular message template based on a length of the given message signature and a frequency of occurrence of the particular message template;
   identifying a predefined field type of each of the one or more message variable values;
   selecting, using at least one processing device, a compression technique to apply to each of the one or more message variable values based on the corresponding identified predefined field type to obtain one or more compressed message variable values, wherein the selected compression technique compresses the one or more message variable values using one or more of: (i) a difference between a predicted next value of the one or more message variable values and an actual value of the one or more message variable values and (ii) a difference between a current value of the one or more message variable values and a base value of the one or more message variable values; and writing, using the at least one processing device, the one or more compressed message variable values and a message signature corresponding to the message template of the at least one log message to a log file.

2. The method of claim 1, wherein a log pattern mining technique is applied to a plurality of historical log messages to learn a plurality of pattern-based message templates having the at least one field during a training phase.

3. The method of claim 2, wherein a parsing technique is applied to one or more of the plurality of pattern-based message templates to identify the predefined field type of the at least one field.

4. The method of claim 1, wherein the selected compression technique is selected based on a performance evaluation of a plurality of compression techniques for the predefined field type.

5. The method of claim 1, wherein the selected compression technique compresses the one or more message variable values by employing one or more of a reduced granularity and a reduced precision of the one or more message variable values, relative to one or more of an original granularity and an original precision of the one or more message variable values.

6. The method of claim 1, further comprising decompressing the log file using a decompression index that maps a plurality of message signatures to corresponding message templates.

7. The method of claim 6, wherein the compression index comprises a key-value database where the plurality of different message templates are keys and the corresponding message signatures are values of the key-value database and the decompression index comprises a key-value database where the plurality of message signatures are keys and the corresponding plurality of different message templates are values of the key-value database.

8. The method of claim 1, wherein the at least one log message is from one or more historical log messages and a real-time stream of log messages.

9. The method of claim 1, further comprising, in response to the message template not being in the compression index, adding the message template and the corresponding message signature to the compression index and initializing a counter associated with the message template.

10. The method of claim 1, further comprising reassigning one or more of the plurality of message signatures based at least in part on a number of times each message template has occurred across the plurality of log messages, relative to occurrences of other message templates, using the counter.

11. A system, comprising:
a memory; and
at least one processing device, coupled to the memory, operative to implement the following steps:
obtaining at least one log message of a plurality of log messages, wherein the at least one log message comprises a message template and one or more message variable values, wherein the message template is repeated across the plurality of log messages and comprises at least one field that is replaced with at least one of the one or more message variable values;
incrementing a counter, associated with the message template, indicating a frequency of occurrence of the message template, wherein the counter is one of a plurality of counters each associated with a respective one of a plurality of different message templates;
obtaining a compression index that maps each of the plurality of different message templates to a corresponding message signature of a plurality of message signatures, wherein the mapping assigns a given message signature to a particular message template based on a length of the given message signature and a frequency of occurrence of the particular message template;
identifying a predefined field type of each of the one or more message variable values;
selecting, using the at least one processing device, a compression technique to apply to each of the one or more message variable values based on the corresponding identified predefined field type to obtain one or more compressed message variable values, wherein the selected compression technique compresses the one or more message variable values using one or more of: (i) a difference between a predicted next value of the one or more message variable values and an actual value of the one or more message variable values and (ii) a difference between a current value of the one or more message variable values and a base value of the one or more message variable values; and
writing, using the at least one processing device, the one or more compressed message variable values and a message signature corresponding to the message template of the at least one log message to a log file.

12. The system of claim 11, wherein a log pattern mining technique is applied to a plurality of historical log messages to learn a plurality of pattern-based message templates having the at least one field during a training phase and wherein a parsing technique is applied to one or more of the plurality of pattern-based message templates to identify the predefined field type of the at least one field.

13. The system of claim 11, wherein the selected compression technique compresses the one or more message variable values by employing one or more of a reduced granularity and a reduced precision of the one or more message variable values, relative to one or more of an original granularity and an original precision of the one or more message variable values.

14. The system of claim 11, wherein the at least one log message is from one or more historical log messages and a real-time stream of log messages.

15. The system of claim 11, further comprising, in response to the message template not being in the compression index, adding the message template and the corresponding message signature to the compression index and initializing a counter associated with the message template.

16. The system of claim 11, further comprising reassigning one or more of the plurality of message signatures based at least in part on a number of times each message template has occurred across the plurality of log messages, relative to occurrences of other message templates, using the counter.

17. A computer program product, comprising a non-transitory machine-readable storage medium having encoded therein executable code of one or more software programs, wherein the one or more software programs when executed by at least one processing device perform the following steps:
obtaining at least one log message of a plurality of log messages, wherein the at least one log message comprises a message template and one or more message variable values, wherein the message template is repeated across the plurality of log messages and comprises at least one field that is replaced with at least one of the one or more message variable values;

incrementing a counter, associated with the message template, indicating a frequency of occurrence of the message template, wherein the counter is one of a plurality of counters each associated with a respective one of a plurality of different message templates;

obtaining a compression index that maps each of the plurality of different message templates to a corresponding message signature of a plurality of message signatures, wherein the mapping assigns a given message signature to a particular message template based on a length of the given message signature and a frequency of occurrence of the particular message template;

identifying a predefined field type of each of the one or more message variable values;

selecting, using the at least one processing device, a compression technique to apply to each of the one or more message variable values based on the corresponding identified predefined field type to obtain one or more compressed message variable values, wherein the selected compression technique compresses the one or more message variable values using one or more of: (i) a difference between a predicted next value of the one or more message variable values and an actual value of the one or more message variable values and (ii) a difference between a current value of the one or more message variable values and a base value of the one or more message variable values; and writing, using the at least one processing device, the one or more compressed message variable values and a message signature corresponding to the message template of the at least one log message to a log file.

18. The computer program product of claim 17, wherein a log pattern mining technique is applied to a plurality of historical log messages to learn a plurality of pattern-based message templates having the at least one field during a training phase and wherein a parsing technique is applied to one or more of the plurality of pattern-based message templates to identify the predefined field type of the at least one field.

19. The computer program product of claim 17, wherein the at least one log message is from one or more historical log messages and a real-time stream of log messages.

20. The computer program product of claim 17, further comprising reassigning one or more of the plurality of message signatures based at least in part on a number of times each message template has occurred across the plurality of log messages, relative to occurrences of other message templates, using the counter.

* * * * *